United States Patent
Das et al.

(10) Patent No.: US 9,451,693 B2
(45) Date of Patent: Sep. 20, 2016

(54) ELECTRICALLY CONDUCTIVE ADHESIVE (ECA) FOR MULTILAYER DEVICE INTERCONNECTS

(75) Inventors: Rabindra N. Das, Vestal, NY (US); Voya R. Markovich, Endwell, NY (US); John M. Lauffer, Waverly, NY (US); Roy H. Magnuson, Endicott, NY (US); Konstantinos I. Papathomas, Endicott, NY (US); Benson Chan, Vestal, NY (US)

(73) Assignee: i3 ELECTRONICS, Inc.

( * ) Notice: Subject to any disclaimer, the term of this patent is extended or adjusted under 35 U.S.C. 154(b) by 0 days.

(21) Appl. No.: 13/198,756

(22) Filed: Aug. 5, 2011

(65) Prior Publication Data

US 2013/0033827 A1 Feb. 7, 2013

(51) Int. Cl.
*H05K 1/11* (2006.01)
*H05K 1/03* (2006.01)

(52) U.S. Cl.
CPC .................. *H05K 1/0313* (2013.01)

(58) Field of Classification Search
USPC .......... 174/259, 260, 262–266; 361/792–795
See application file for complete search history.

(56) References Cited

U.S. PATENT DOCUMENTS

| | | | |
|---|---|---|---|
| 5,080,958 A | 1/1992 | Patterson et al. | |
| 5,293,504 A * | 3/1994 | Knickerbocker et al. | 174/262 |
| 5,688,584 A | 11/1997 | Casson et al. | |
| 5,948,533 A | 9/1999 | Gallagher et al. | |
| 6,518,516 B2 | 2/2003 | Blackwell et al. | |
| 6,742,247 B2 * | 6/2004 | Pai et al. | 29/829 |
| 7,081,675 B2 | 7/2006 | Yim et al. | |
| 7,345,105 B2 | 3/2008 | Yoshino et al. | |
| 7,410,601 B2 | 8/2008 | Sato et al. | |
| 7,569,162 B2 | 8/2009 | Nomiya et al. | |
| 2004/0118598 A1 * | 6/2004 | Fuller et al. | 174/255 |
| 2007/0054114 A1 | 3/2007 | Kumakura | |
| 2007/0221404 A1 * | 9/2007 | Das et al. | 174/264 |
| 2008/0070014 A1 * | 3/2008 | Ohtsuki et al. | 428/209 |
| 2009/0011226 A1 | 1/2009 | Takeuchi et al. | |
| 2009/0269574 A1 | 10/2009 | Liu | |

* cited by examiner

*Primary Examiner* — Jeremy Norris

(57) ABSTRACT

A multilayer capable electrically conductive adhesive (ECA) mixture for connecting multilevel Z-axis interconnects and a method of forming the ECA for connecting multilevel Z-axis interconnects. The multilayer capable ECA contains a mixture of constituent components that allow the paste to be adapted to specific requirements wherein the method of making a circuitized substrate assembly in which two or more subassemblies having potentially disparate coefficients of thermal expansion (CTE) are aligned and Z-axis interconnection are created during bonding. The metallurgies of the conductors, and those of a multilayer capable conductive paste, are effectively mixed and the flowable interim dielectric used between the mating subassemblies flows to engage and surround the conductor coupling.

43 Claims, 7 Drawing Sheets

ELECTRICALLY CONDUCTIVE ADHESIVE (ECA) FOR MULTILAYER DEVICE INTERCONNECTS

FIELD OF INVENTION

The present invention relates to a compositionally multi-layered gradient electrically conducting adhesive (ECA) for concurrent multilayer substrate Z-interconnect laminations and, more specifically, to a conducting paste that can be used for connecting multiple, disparate composition substrate layers having Z-interconnects, such as circuit boards, printed wiring boards, circuitized substrates, and the like.

CROSS REFERENCE TO CO-PENDING APPLICATIONS

In pending patent application Ser. No. 11/802,434, filed May 10, 2007, there is defined a circuitized substrate which includes a conductive paste for providing electrical connections. The paste, in one embodiment, includes a metallic component including nanoparticles and may include additional elements such as solder or other metal microparticles, as well as a conducting polymer and organic. The particles of the paste composition sinter and, depending on what additional elements are added, melt as a result of lamination to thereby form effective contiguous circuit paths through the paste. A method of making such a substrate is also provided, as is an electrical assembly utilizing the substrate and including an electronic component such as a semiconductor chip coupled thereto. This patent application '434 is assigned to the same Assignee as the present invention and is hereby incorporated herein.

BACKGROUND OF THE INVENTION

One of the steps of fabricating multilayer printed circuit boards (PCBs) and laminate chip carriers (LCC) involves the use of a conducting paste to make connections between Z-axis interconnects of the substrates. Historically, connecting the Z-axis interconnect junctions between multiple, separate substrate layers of different boards simultaneously to consistently perform with minimal failure has been as a challenge.

As is known, multilayered PCBs, LCCs, and like organic products permit the formation of multiple circuits using minimum volume or space. These typically comprise a stack of electrically conductive layers of signal, ground and/or power planes separated from each other by a layer of organic dielectric material. The planes may be in electrical contact with each other by plated holes passing through the dielectric layers. The plated holes are often referred to as vias if internally located, blind vias if extending a predetermined depth within the board from an external surface, or plated thru-holes (PTHs) if extending substantially through the board's full thickness. By the term thru-hole as used herein is meant to include all three types of such board openings.

Today's methods for fabricating such PCBs, chip carriers and the like typically comprise fabrication of separate inner-layer circuits (circuitized layers), which are formed by coating a photosensitive layer or film over a copper layer of a copper clad inner-layer base material bonded (e.g., laminated) to a dielectric layer. The organic photosensitive coating is imaged, developed and the exposed copper is etched to form conductor lines, pads and the like, depending on the desired circuit pattern. After etching, the photosensitive film is stripped from the copper leaving the circuit pattern on the surface of the inner-layer base material. This processing is also referred to as photolithographic processing in the PCB art and further description is not deemed necessary.

Following the formation of individual inner-layer circuits, each including at least one conductive layer and supporting dielectric layer, a multilayer stack assembly is formed by preparing a lay-up of several inner-layers, ground planes, power planes, etc., typically separated from each other by a dielectric, organic pre-preg typically comprising a layer of glass, typically fiberglass, cloth impregnated with a partially cured material, typically a B-stage epoxy resin. Such an organic material is also referred to in the industry as "FR-4" dielectric material. The top and bottom outer layers of the stack usually comprise copper clad, glass-filled, epoxy planar substrates with the copper cladding comprising exterior surfaces of the stack. The stack is laminated to form a monolithic structure assembly using heat and pressure to fully cure the B-stage resin. The stacked assembly so formed typically has metal (usually copper) cladding on both of its exterior surfaces. Exterior circuit layers are formed in the copper cladding using procedures similar to the procedures used to form the inner-layer circuits. A photosensitive film is applied to the copper cladding and the coating is then exposed to patterned activating radiation and developed. An etching solution such as cupric chloride is then used to remove copper bared by the development of the photosensitive film. Finally, the remaining photosensitive film is removed to provide the exterior circuit layers. The resulting assembly may include as many as thirty or more conductive layers and a corresponding number of dielectric layers, all laminated into the final stacked assembly in a simultaneous manner using conventional lamination processes.

Rather than form a large assembly comprising several individual conductive-dielectric layered members, as described above, it is often desirable to initially form a stacked circuitized substrate "subassembly" including two or more conductive layers and associated dielectric layers, the laminated subassembly including a plurality of conductor pads (e.g., copper) on one or both external surfaces. These pads are often formed using photolithographic processing, as mentioned above. Two or more such subassemblies are then aligned and laminated, using an interim organic pre-preg layer such as described above, to form a final multilayered assembly. Additional individual conductor planes and dielectric layers may be included during the lamination to form even more layers for the final assembly.

In such a subassembly type of process, it is necessary to provide interconnections between the various subassemblies. This is accomplished in one manner by aligning the respective outer conductor pads on one subassembly with those on another and then bringing the two together using conventional lamination procedures. The two subassemblies are separated before lamination by an interim dielectric layer, preferably a conventional pre-preg. This dielectric serves to insulate various external conductive elements (e.g., signal lines) of one subassembly from another while allowing the designated aligned pairs of conductor pads to mate and form an electrical connection. A conductive solder paste may be used between the two mating pads to enhance the connection.

For assemblies and subassemblies as defined above, electrically conductive thru-holes (or interconnects) may also be used to electrically connect individual circuit layers and may be of one or more of the three types (buried and blind vias, and PTHs) of connections defined above. If such thru-holes are used, the bare hole walls are usually subjected to at least one pre-treatment step after which the walls of the dielectric material are catalyzed by contact with a plating catalyst and metallized, typically by contact with an electro-less or electrolytic copper plating solution. If the thru-holes are PTHs (those which extend through the entire assembly or subassembly), interconnections are thus formed between selected ones of the circuitized layers. Connectivity between aligned thru-holes of mating subassemblies is accomplished preferably using a conductive paste or the like. Such pastes are known to include a highly conductive metal such as silver in the form of flakes.

Laminating several assemblies and/or subassemblies that possess different coefficient of thermal expansion (CTE) may require specific curing conditions that require different conducting pastes, such as a low melting point filler paste (LMP), silver paste, copper-gold paste, solder paste, etc., different B-staged paste, cured and uncured paste, or their mixture.

DISCUSSION OF RELATED ART

U.S. Pat. No. 7,569,162 by Nomiya, et al., granted Aug. 4, 2009 for ELECTRICALLY CONDUCTIVE PASTE AND MULTILAYER CERAMIC SUBSTRATE discloses an electrically conductive paste used for forming wiring conductors, such as via holes disposed on a multilayer ceramic substrate, wherein the temperature range in which sintering is effected in a firing step can be controlled. The electrically conductive paste contains a metal powder, a glass frit, and an organic vehicle. An inorganic component, which is not sintered at a sintering temperature capable of sintering the ceramic layers included in the multilayer ceramic substrate in the firing step, is disposed on particle surfaces of the metal powder. The glass frit has a softening point lower than the above-described sintering temperature.

U.S. Pat. No. 7,410,601 by Sato, et al., granted Aug. 12, 2008 for CONDUCTIVE PASTE FOR MULTILAYER ELECTRONIC PART discloses a conductive paste for a multilayer electronic part that can be screen-printed on a ceramic green sheet, comprising 70-95 weight % of conductive metal powder, a resin, and a solvent, wherein a phase angle $\delta$ in a dynamic viscoelastic measurement is within a range of from 43° C. to 72° C. at a frequency of 0.05 Hz and is within a range of 63° C. or less at a frequency of 30 Hz.

U.S. Pat. No. 7,345,105 by Yoshino, et al., granted Mar. 18, 2008 for CONDUCTIVE ADHESIVE COMPOSITION discloses a conductive adhesive composition obtained by mixing a binder resin with 30-98 wt % based on the adhesive composition of a silver powder as a conductive agent. The silver powder contains a silver powder consisting of flat primary particles and having a massive agglomerate structure and a tap density of 0.1-1.5 g/cm$^3$ in an amount of 30-98 wt % based on the adhesive composition. The conductive adhesive composition cures into a product having improved conductivity, adhesion, heat resistance, moisture resistance, ease of working and heat transfer.

U.S. Pat. No. 7,081,675 by Yim, et al., granted Jul. 25, 2006 for MULTILAYERED ANISOTROPIC CONDUCTIVE ADHESIVE FOR FINE PITCH discloses an anisotropic conductive adhesive for a fine pitch having a conductive adhesive layer and a nonconductive adhesive layer formed on one surface or both surfaces of the conductive adhesive layer. The anisotropic conductive adhesive for a fine pitch can be used to adhere an integrated circuit, on which a plurality of bumps each having a second height are formed, to a substrate, on which a plurality of electrodes each having a first height are formed keeping predetermined distances from each other, so that the integrated circuit is electrically connected to the electrodes. The anisotropic conductive adhesive includes a nonconductive first adhesive layer and a second adhesive layer. The nonconductive first adhesive layer includes a thermosetting resin and a hardener for hardening the thermosetting resin and has a first thickness between 0.5-1.5 of the second height. The second adhesive layer includes a thermosetting resin, a hardener for hardening the thermosetting resin, and a plurality of conductive particles each having an average particle diameter of ½ or less of the width of gaps between the plurality of electrodes and a first density dispersion, has a second thickness larger than two times the average particle diameter of the conductive particles, and is formed on one surface of the nonconductive first adhesive layer.

U.S. Pat. No. 6,518,516, by Blackwell, et al., granted Feb. 11, 2003 for MULTILAYERED LAMINATE discloses multilayered laminates, substructures and associated methods of fabrication. The multilayered laminate includes in sequential order a first intermediate layer having microvias and conductive lands, a plurality of signal/power plane substructures, wherein a dielectric material of an intervening dielectric layer insulatively separates each pair of successive signal/power plane substructures, and a second intermediate layer having microvias and conductive lands.

U.S. Pat. No. 5,948,533, by Gallagher, et al., granted Sep. 7, 1999 for VERTICALLY INTERCONNECTED ELECTRONIC ASSEMBLIES AND COMPOSITIONS USEFUL THEREFOR discloses assemblies that comprise substrate boards with multiple layer electronic assemblies. The multiple layers comprise individual layers of circuitry separated and adhered by dielectric materials selectively coated and/or filled with a transient liquid phase sintered (TLPS) material. The TLPS is formulated to be electrically conductive, and thereby serves to convey current between the layers of circuitry. In addition, the TLPS is easily workable so that it is amenable to automated, stepwise construction of multilayer circuitry without the need for labor intensive drilling and filling of conductive vias.

U.S. Pat. No. 5,688,584, by Casson, et al., granted Nov. 11, 1997 for MULTILAYER ELECTRONIC CIRCUIT HAVING A CONDUCTIVE ADHESIVE discloses a multilayer circuit board having three or more conductive layers, with at least two conductive layers electrically and mechanically connected by an interconnecting adhesive layer. The interconnecting adhesive layer comprises a conductive adhesive material having a plurality of deformable, heat fusible metallic particles dispersed substantially throughout a non-conductive adhesive. The fabricated multilayer circuit boards have interconnections that are heat resistant and capable of withstanding thermal cycling and typical circuit board finishing and assembly processes.

U.S. Pat. No. 5,080,958, by Patterson, et al., granted Jan. 14, 1992 for MULTILAYER INTERCONNECTS discloses a multilayer interconnect comprising a ceramic substrate, a patterned conductor layer, a layer of acrylic or acrylate adhesive, an organic insulating film, and a metal foil layer. Active electrical components can be soldered onto the metal foil layer. These circuits are useful in under the hood automotive applications.

United States Published Patent Application No. 2007/0054114, by Kumakura, published Mar. 8, 2007 for MULTILAYER ANISOTROPIC CONDUCTIVE ADHESIVE AND CONNECTION STRUCTURE USING THE SAME describes a multilayer anisotropic conductive adhesive in which resistance to reflow is sufficiently obtained and which can facilitate connection and a connection structure using the multilayer anisotropic conductive adhesive. A multilayer anisotropic conductive adhesive includes two adhesive layers laminated, each of which contains an insulating resin and a hardening agent; where conductive particles are contained in adhesive layers, and at least the top or bottom adhesive layer has the differential scanning calorimetry (DSC) exothermic peak temperature of between 130° C. and 180° C. Further, a connection structure is constructed in which a first electronic component that has an electrode and an insulating film on the surface thereof and a second electronic component that has an electrode on the surface thereof are electrically connected through the above-described multilayer anisotropic conductive adhesive.

United States Published Patent Application No. 2009/0011226, by Takeuchi, et al., published Jan. 8, 2009 for CONDUCTIVE POLYMER MULTILAYER BODY describes a conductive polymer multilayer body including a substrate and a thin film provided thereon with a thickness of 1 µm or less, which is formed of a conductive polyaniline composition containing a protonated substituted or unsubstituted polyaniline composite dissolved in an organic solvent which is substantially immiscible with water and a compound having a phenolic hydroxyl group.

United States Published Patent Application No. 2009/0269574, by Liu, published Oct. 29, 2009 for FUNCTIONAL MULTILAYER ANISOTROPIC CONDUCTIVE ADHESIVE FILM AND METHOD FOR PREPARING THE SAME describes a functional multilayer anisotropic conductive adhesive film, capable of bonding and package 0.18-0.13 micron IC chips and high density chip-on-flex (COF), including a monomer layer, a reinforcing layer, a low-temperature, hot-melt resin layer, and a conductive particle layer, successively bonded by coating and drying processes. The monomer layer comprises a copolymer of butyl acrylate, methyl acrylate, glycol acrylate, and tetramethyl butyl peroxy-2-ethyl hexanoate. The reinforcing layer comprises long chain imidazole derivatives. The hot-melt resin layer comprises polymer of tocopheroxyl, novolac epoxy, acrylic rubbers and elastic mixture of acrylic rubbers and styrene-butadiene rubbers. The conductive particle layer comprises conductive particles and micro-encapsulating resin for receiving the conductive particles. Diameter of the conductive particles is selected from the group consisting of 3.00 µm±0.05, 3.25 µm±0.05, 3.50 µm±0.05, 3.75 µm±0.05 and 4.00 µm±0.05.

For Z-interconnects, electrical connection is achieved through conductive paste/adhesive. But the United States patents and published patent applications cited above fail to adequately describe paste structure in the Z-interconnects. In general, a conductive paste-filled core used for joining and an individual paste-filled core are laminated together to produce a final Z-interconnect structure. The present invention uses a variety of differently processed paste-filled Z-interconnect structures. The paste structure in the final Z-interconnect (joint) is no longer a simple structure.

It is therefore an object of the invention to establish conductive paste structure in the Z-interconnects.

The previously disclosed United States patents and published patent applications fail to adequately describe the present invention's multilayer electrical interconnect adhesive structure preparation techniques that enhance the physical contact connection of multiple levels of Z-interconnect structures.

It is therefore an object of the invention to provide a multilayer interconnect adhesive structure preparation technique to enhance the electrical and physical contact of multilayer Z-interconnect structures.

It is another object of the invention to provide a multilayer interconnect adhesive structure to enable the electrical and physical link up in one lamination process step of multilayer Z-interconnect structures having potential differing CTE.

It is therefore an object of the invention to provide an interconnect structure preparation technique to enhance the electrical and physical contact of at least two Z-interconnection structures.

It is also a further object of this invention to provide an interconnect structure preparation technique to enhance the electrical and physical contact to enhance circuit board interfacial adhesion between adjacent circuit boards after lamination.

It is still an object of this invention to utilize the multilayer interconnect adhesive structure to increase dimensional stability and electrical connection of separate substrate layers during lamination.

SUMMARY OF THE INVENTION

According to the present invention, there is provided a conducting paste for multilayer interconnects. More specifically, the invention is applicable to situations in which at least two substrate surfaces are joined concurrently in a lamination step to create interlayer substrate interconnections.

In another embodiment of the invention, there is provided a conducting paste for interconnects between substrates and more specifically, where at least two joined substrates have dissimilar CTEs.

In a third embodiment of the invention, there is provided a single conducting paste for multilayer interconnects and more specifically, is applicable to situations in which at least two dissimilar material composition substrates that necessitate different temperature and pressure settings are joined in a single lamination step that encompasses the necessary ranges of temperature and pressure.

BRIEF DESCRIPTION OF THE DRAWINGS

A complete understanding of the present invention may be obtained by reference to the accompanying drawings, when considered in conjunction with the subsequent, detailed description, in which.

DETAILED DESCRIPTION OF THE PREFERRED EMBODIMENT

Figure 1:
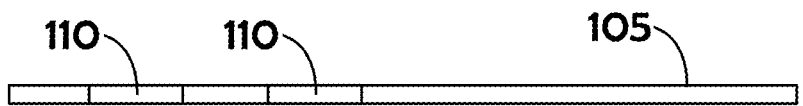
FIGS. 1 through 4 are side elevational views, in section, showing the steps of making a circuitized substrate for use in one embodiment of the invention.

Generally speaking, the present invention is a method and structure for a more efficient Z-axis interconnection of separate substrate surfaces utilizing a multilayer capable adhesive. The interconnection is achieved by lamination of a structure having adhesive disposed on metallized surfaces such as pads and lines wherever interconnection between layers is desired. The use of a multilayer capable adhesive between the connecting points enables the physical contact between separate assemblies having differing CTEs to be effectively laminated and Z-axis circuits created that results in a reduced electrical connection yield loss of the Z-axis interconnect structures.

For a better understanding of the present invention, together with other and further objects, advantages and capabilities thereof, reference is made to the following disclosure and appended claims.

By the term "circuitized substrate" as used herein is meant to define a structure including at least one dielectric layer having at least one surface having thereon at least one circuit. Examples of dielectric materials suitable for use in such structures include fiberglass-reinforced or non-reinforced epoxy resins (sometimes referred to simply as FR-4 material, meaning its Flame Retardant rating), polytetrafluoroethylene (Teflon), polyimides, polyamides, cyanate resins, photoimageable materials, and other like materials, or combinations thereof. Examples of electrically conductive materials for the circuit layers include copper or copper alloy. If the dielectric is a photoimageable material, it is photoimaged or photo-patterned, and developed to reveal the desired circuit pattern, including the desired opening(s) as defined herein, if required. The dielectric material may be curtain coated or screen applied, or it may be supplied as a dry film or in other sheet form.

By the term "electroplating" as used herein is meant a process by which a metal in its ionic form is supplied with electrons to form a non-ionic coating on a desired substrate. The most common system involves: a chemical solution which contains the ionic form of the metal, an anode (positively charged) which may consist of the metal being plated (a soluble anode) or an insoluble anode (usually carbon, platinum, titanium, lead, or steel), and finally, a cathode (negatively charged) where electrons are supplied to produce a film of non-ionic metal.

By the term "electroless plating" (also known as chemical or auto-catalytic plating) as used herein is meant a non-galvanic type of plating method that involves several simultaneous reactions in an aqueous solution, which occur without the use of external electrical power. The reaction is accomplished when hydrogen is released by a reducing agent, normally sodium hypophosphite, and oxidized thus producing a negative charge on the surface of the part.

By the term "electronic package" as used herein is meant a circuitized substrate assembly as taught herein having one or more ICs (e.g., semiconductor chips) positioned thereon and electrically coupled thereto. In a multi-chip electronic package, for example, a processor, a memory device and a logic chip may be utilized and oriented in a manner designed for minimizing the limitation of system operational speed caused by long connection paths. Some examples of such packages, including those with a single chip or a plurality thereof, are also referred to in the art as chip carriers.

By the term "etch" and "etching" as used herein is meant a process by where a surface of a substrate is either selectively etched using a photoresist or covered by a mask prior to plasma treating, both methods are meant to transfer an image onto the substrate for subsequent further processing.

By the term "information handling system" as used herein is meant any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products are well known in the art and are also known to include PCBs and other forms of circuitized substrates as part thereof, some including several such components depending on the operational requirements thereof.

By the term "laser ablation" as used herein is meant the process of removing material from a solid surface by irradiating it with a laser beam. At low laser flux, the material is heated by the absorbed laser energy and evaporates or sublimes. At high laser flux, the material is typically converted to a plasma. The term laser ablation as used herein refers to removing material with a pulsed laser as well as ablating material with a continuous wave laser beam if the laser intensity is high enough.

By the term "thru-hole" as used herein to define an electrically conductive structure formed within a circuitized substrate as defined herein and is meant to include three different types of electrically conductive elements. It is known in multilayered PCB's and chip carriers to provide various conductive interconnections between various conductive layers of the PCB and carrier. For some applications, it is desired that electrical connection be made with almost if not all of the conductive layers. In such a case, thru-holes are typically provided through the entire thickness of the board, in which case these are often also referred to as "plated thru-holes" or PTHs. For other applications, it is often desired to also provide electrical connection between the circuitry on one face of the substrate to a depth of only one or more of the inner circuit layers. These are referred to as "blind vias", which pass only part way through (into) the substrate. In still another case, such multilayered substrates often require internal connections ("vias") that are located entirely within the substrate and covered by external layering, including both dielectric and conductive. Such internal "vias", also referred to as "buried vias", may be formed within a first circuitized substrate which is then bonded to other substrates and/or dielectric and/or conductive layers to form the final, multilayered embodiment. Therefore, for purposes of this application, the term "thru-hole" is meant to include all three types of such electrically conductive openings.

The terms "electrically conductive adhesive (ECA)" or "electrically conductive paste" or "paste" as used herein are meant to include a bondable (e.g., capable of lamination) conductive material capable of being dispensed within openings of the type taught herein. Typical examples of bondable electrically conductive material are conductive pastes such as silver-filled epoxy paste obtained from E.I. duPont deNemours under the trade designation CB-100, Ablebond 8175 from the Ablestick Company, and filled polymeric systems, thermoset or thermoplastic type containing LMP particles or other metal particles such as gold, tin, palladium, copper, alloys and combinations thereof. One particular example is coated copper paste. Metal-coated polymeric particles disposed in a polymeric matrix can also be used.

The terms "multi layer paste" or "multilayer electrically conductive adhesive" as used herein are meant to include a bondable (e.g., capable of lamination) conductive material which, when laminated, results a new composition at the paste-paste interface and/or at the joining interface of Z-interconnects. If one paste contains Cu, tin-lead particles and other paste contain tin and silver particles that can form high melting tin-silver-Cu (SAC) or a tin-copper solid solution at the paste-paste interface during lamination. Tin and silver particles can form tin-silver-Cu (SAC) or tin-copper solid solution with a Cu pad during lamination. Thus single paste can generate multiple compositions in Z-interconnect structure. Multilayer paste-based electrical connections can be organic or inorganic or organic-inorganic or their mixtures. A multilayer paste with conducting polymer or a polymer with conducting carbon can be considered organic; multilayer paste with metal, alloy, oxide (e.g., Indium tin oxide) or the mixture can be considered inorganic; and multilayer paste with a polymer and metal (silver-epoxy) mixture can be considered organic-inorganic.

According to one aspect of the invention, there is provided a method of making a circuitized substrate assembly. At least three circuitized substrate subassemblies are provided, each subassembly including at least one dielectric layer and at least one conductive layer including a plurality of metallic conductor pads as part thereof. The circuitized substrate subassemblies are aligned relative to one another such that each of the metallic conductor pads of the first circuitized substrate subassembly are aligned with a corresponding metallic conductor pad of the second circuitized substrate subassembly in a facing manner and continuing on the same method. A flowable dielectric layer is positioned between each of the circuitized substrate subassemblies, this flowable dielectric layer including a plurality of openings therein, each opening aligning with a respective pair of aligned and facing metallic conductor pads. A quantity of multilayer solder paste is deposited on at least one of the metallic conductor pads of each of said pairs of aligned and facing metallic conductor pads. The circuitized substrate subassemblies are bonded together using heat and pressure so the metallurgies of the various solder paste structure and metallic conductor pads are combined to form an electrical connection therebetween and the material of the flowable dielectric layer will flow into the openings to substantially fill the openings and physically contact and surround the electrical connections.

In semiconductor devices, conducting adhesives are becoming more and more important as interconnecting materials. A single conductive adhesive may not be suitable for multiple surface attachments and may require layers of different conductive adhesives instead of a single type of conductive adhesive.

The present invention objective is to provide a multilayer paste that can overcome processing issues as well as satisfy individual substrate property requirements. Multilayer pastes can be composites of a polymer resin and conductive fillers. Metal to metal bonding between conductive fillers provides electrical conductivity, whereas the polymer resin provides simplified processing and mechanical robustness. Multilayer paste is differentiated from normal conducting paste in that it has a compositional gradient contingent upon the surface to which it is applied.

FIGS. 1 through 4 illustrate the steps of making a circuitized substrate for use as substrate layers in one embodiment of the invention. In FIG. 1, a conductive layer 105, preferably a copper sheet, is etched using an etching solution such as cupric chloride to define a plurality of openings 110 therein. Although only two openings are depicted in FIG. 1, this is meant to be representative only. Openings 110 in the current embodiment described here are meant to form clearance openings in the finished substrate, such that conductive openings (thru-holes, as defined above) may be formed within the substrate and extend through the substrate without electrically contacting the conductive layer 105. Clearance openings are known in the PCB art and further description is not deemed necessary. Layer 105 is preferred in the invention to provide an interim conductive layer that may be used as power or ground for a portion of the circuitry of the circuitized substrate of this invention. As defined below, at least one thru-hole to be used in the substrate will be electrically connected to layer 105 for this purpose.

Figure 2:
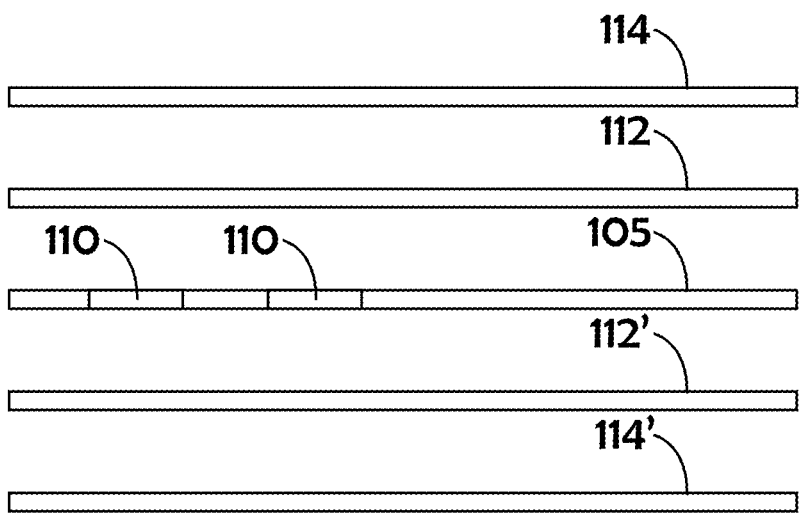

In FIG. 2, layer 105 is shown aligned with opposing dielectric layers 112 and 112', in addition to respective opposing conductive layers 114 and 114', these latter two conductive layers 114 and 114' being oriented adjacent the outside surfaces of the respective dielectric layers 112 and 112', respectively. Layers 114 and 114' are also preferably copper and may possess the same dimensions as layer 105, although the thickness of said layers 114 and 114' may be different than that of layer 105, with one example of such thickness being approximately 0.012 mm. In this embodiment (and also in other embodiments defined herein), each of the dielectric layers 112 and 112' is selected with a melting temperature sufficiently high to allow sintering and, possibly, melting of the conductive paste (defined below) with the openings in these dielectric layers without melting the dielectric material itself. This represents an important aspect of the invention for reasons understood by the description below and elsewhere herein.

In one embodiment, the dielectric material may be referred to as a high temperature dielectric layer, meaning that it can withstand temperatures greater than approximately 350° C. for a time period long enough to enable successful lamination of a multilayered substrate assembly comprising of two or more substrates. A preferred example of such material known today is "RO2800" dielectric material sold by Rogers Corporation of Rogers, Conn. "RO2800" is a polytetrafluoroethylene (PTFE) composite material having a low dielectric constant and including fused silica as one of the composition elements. It is rated with 0% water solubility and has a specific gravity of 2.1. Each layer 112 and 112' includes an initial thickness of approximately 0.05 mm. The aligned subassembly of FIG. 2 is now laminated together to form a sandwich, as now seen in FIG. 3. Conventional lamination processing and equipment may be used. In one example, the five layers shown in FIG. 2 may be laminated at a temperature of approximately 365° C. using a pressure of approximately 2000 pounds per square inch (PSI) for approximately 125 minutes.

Although the use of two dielectric layers and three conductive layers has been described, it is to be understood that in the broadest aspects of this invention, only one dielectric layer and two conductive layers are required, with the thru-hole connections to be formed herein (using the conductive pastes taught herein) designed to interconnect the two conductive layers through the interim dielectric layer.

Figure 3:
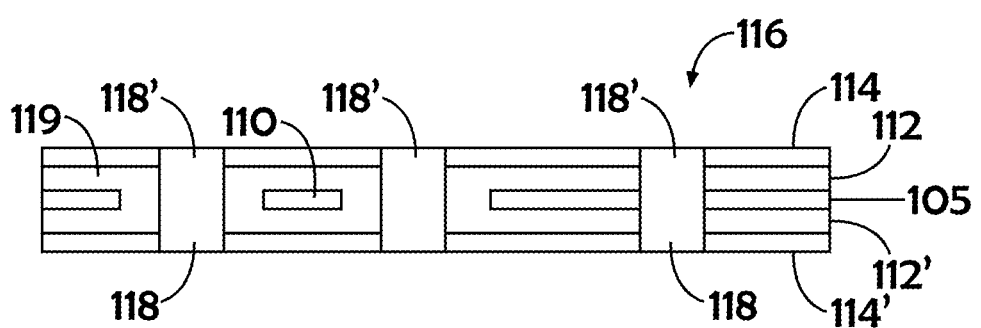

As also seen in FIG. 3, the laminating of the multiple layers of FIG. 2 in effect results in a substantially single, combined dielectric layer due to the "blending" of both layers 112 and 112' during the lamination. As stated, the use of the interim conductive layer 105 adds more capability to the final substrate. The structure shown in FIG. 3 may also be referred to as a "core" substrate, meaning that it may be aligned with and bonded to other substrates to form a multilayered substrate such as a PCB.

The resulting laminated structure 116 is shown in FIG. 3. When compressed from the layers in FIG. 2 having the above initial thickness dimensions, the laminated structure 116 possesses a total thickness of approximately 0.160 mm. After lamination, a plurality of thru-holes 118 is formed within structure 116, preferably by laser or mechanical drilling. As mentioned hereinabove, the dielectric material of layers 112 and 112' has blended and thereby extends within the clearance openings 110 as a result of the lamination step, such that this combined material 119 now forms the side walls of the portion of the thru-hole 118 located within layer 105. Further, it is noted that openings 110 have the conductive material of layers 114 and 114' for the walls in the outer portions of the laminated structure. FIG. 3 also shows that an opening 118 is formed within the structure at a location distant from the openings 110 such that the opening (to the right in FIG. 3) will physically contact middle conductive layer 105, also mentioned above. Thus, this particular opening 118 includes in the sidewall exposed conductive material at layer 105, unlike the other two openings 118' in FIG. 3. As explained below, this represents an alternative means of providing electrical coupling of selected elements of the invention.

Figure 4:
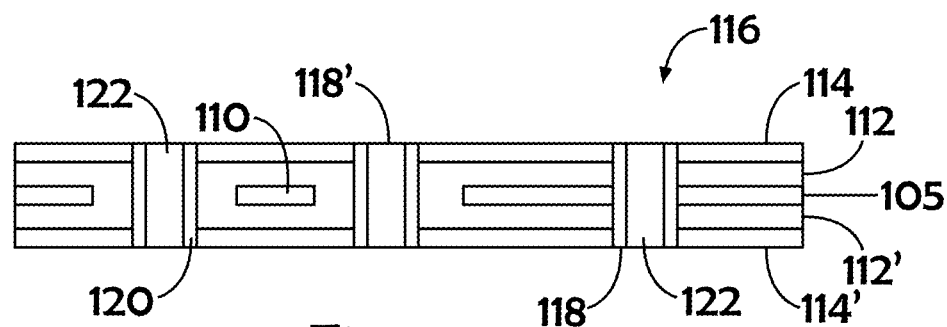

In FIG. 4, each of the thru-holes 118 is plated, preferably with copper, to form inner conductive layers 120. Importantly, this is an optional step in making the substrate of the invention because, without this step, it is possible to still provide conductive thru-holes here (by using the conductive paste described below). The thin added plating 120 is desired in some occasions to provide an even more enhanced connection. A preferred method of accomplishing the plating is to "flash" plate electro-less copper. This plating process typically comprises four operations: cleaning; activation; acceleration; and deposition. During the cleaning phase, organic contaminants are removed from exposed metal surfaces. Activation includes a dip in a catalyst bath typically including hydrochloric acid and possibly tin or sodium chloride, and activation in a bath of hydrochloric acid, tin chloride and palladium chloride. The tin (Sn+2) ion reduces the palladium (Pd+2) to palladium, which is deposited on the substrate. Remaining Sn+2 and Sn+4 are selectively removed by an accelerator such as fluoboric or sulfuric acid with hydrazine.

Key elements of the electro-less copper chemistry include sodium hydroxide, formaldehyde, EDTA (or other chelater) and a copper salt. During the complex reaction with the palladium as a catalyst, the formaldehyde reduces the copper ions to metallic copper. Each layer 120 has a thickness of approximately 0.001 mm. It is seen in FIG. 4 that the plated opening to the right is electrically coupled to inner layer 105 because the plating is deposited on the exposed areas of layer 105. The plating of the other two openings to the left in FIG. 4 is in contact with the defined dielectric material of layers 112 and 112' in addition to the outer conductive layers 114 and 114'. The right opening 118 is also in contact with the outer conductive layers 114 and 114'. It is again to be understood that forming plated layers 120 is an optional step in forming a substrate as described herein, but may be preferred in some circuit designs to further assure sound conductive paths in these portions of the structure.

The next step, as also shown in FIG. 4, involves the deposition of multilayer capable conductive paste 122 within each of the plated openings 120. Such deposition may be accomplished using conventional paste printing processes or dispensing through conventional needles.

Figure 5:
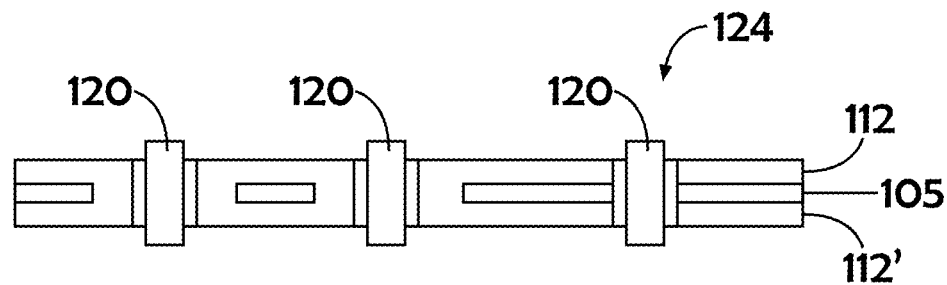
FIG. 5 illustrates an optional step that may be performed on the substrate of FIG. 4 to better enable it to perform as an interim substrate such as may be used in the assembly shown in FIG. 6.

FIG. 5 represents an alternative structure 124 which may be formed from the substrate 116 of FIG. 4. As mentioned, substrate 124 may serve more effectively as an interconnecting substrate in which the conductive pastes engage conductors on other substrates and thereby form a series of conducting paths from the coupled substrates.

Figure 6:
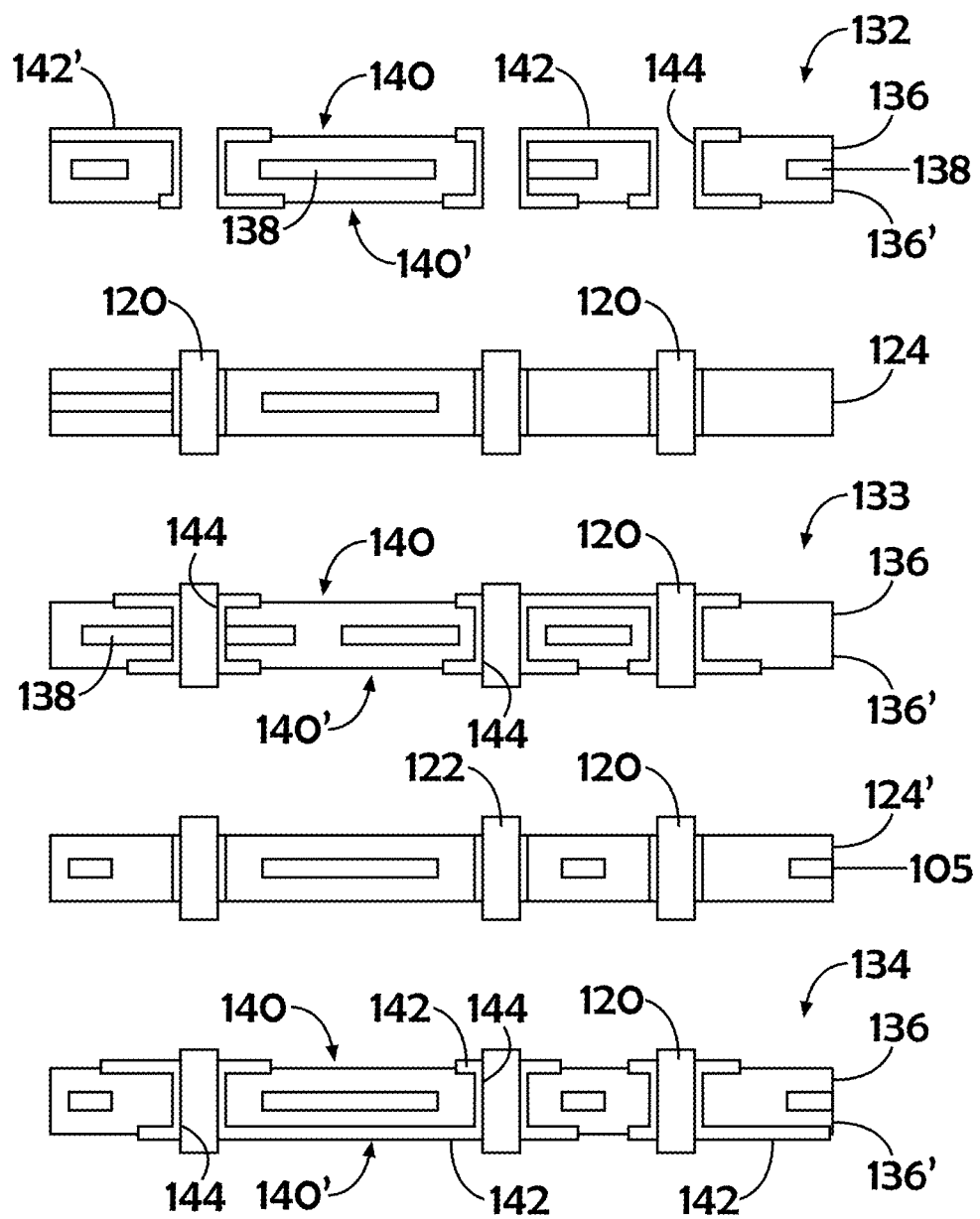
FIG. 6 is an exploded, side elevational view, in section, showing the various parts of a multilayered circuitized substrate assembly according to another embodiment of the invention.

One example of such a formation is presented in FIG. 6. This interim substrate 124 provides a plurality of electrical connections through the paste using the sintered and possibly melt-formed electrical paths. Substrate 124 is similar to substrate 116 of FIG. 4 except that the outer conductive layers 114 and 114' (and the portions of the plated internal layers 120 on said layers 114 and 114') are removed. Such removal, preferably by etching, leaves portions of the conductive paste protruding externally of the substrate main body portion and thus is more adaptable for engaging conductors of other substrates such as shown (and explained below) in FIG. 6. It should also be understood that the substrate 116 of FIG. 4 may serve as such an interconnecting structure, e.g., by providing interim sheets of dielectric (one example being known "pre-preg" dielectric) between substrate 116 and the other substrates, with openings formed therein to accommodate multilayer capable conductive paste 122 within the substrate's holes 118. When the substrates 116 are laminated, paste 122 moves through the interim dielectric layers and into corresponding openings of the other substrate or against conductors or pads on the facing surfaces. Either way, effective connections are completed, using the paste as the interconnecting medium.

FIG. 6 represents one example of a multilayered circuitized substrate assembly 130 according to one embodiment of the invention. Assembly 130 utilizes circuitized substrate 124 of FIG. 5 as interconnectors to electrically couple three substrates 132, 133, and 134. Each substrate 132, 133, and 134 may include at least one dielectric layer 136 (preferably two, including a second layer 136') with at least one conductive layer 138 (preferably two additional outer conductive layers 140 and 140') for each, one or both of these added layers being in the form of a signal layer having a plurality of electrical conductors 142 (in FIG. 6, these are preferably signal lines or pads) as part thereof. The dielectric material for each of the dielectric layers of the substrates 132, 133, and 134 is preferably a high temperature dielectric and preferably the same material as that used for layers 112 and 112' of the interconnecting substrate 124 described above. Substrates 132, 133, and 134 may also include a plurality of thru-holes, including in the form of a PTH 144 or a blind via (not shown), for being electrically coupled to designated conductive elements of the substrates. The five substrates shown in FIG. 6 are aligned to assure subsequent electrical connection between corresponding conductive elements (especially between the projecting multilayer capable conductive paste 122 segments and corresponding, facing conductive elements of the opposing substrates). For example, the multilayer capable conductive paste 122 (not shown in substrate 132 of this FIGURE) in the middle of substrate 124' aligns with the corresponding upper conductor 142 on the upper surface of substrate 134. The upper projecting segment of this same paste is aligned to connect to the lower conductive portion of a PTH 144 located on the lower surface of the substrate 133. Such a conductive portion also understandably represents an electrical "conductor" such as the conductors 142 because it is capable of being engaged by paste and thus electrically coupled thereto. As such, a sound electrical path is thus formed between lower right pad 142 on substrate 134 and the conductive layer 142' of top substrate 132 when the five substrates of FIG. 6 are laminated together. Several other electrical paths are readily discernible from the structure formed using these five substrates and further description is not considered necessary.

Significantly, the multilayer capable conductive paste as used in this embodiment includes a metal component including nanoparticles. Metals which may form the nanoparticles include copper, silver, gold, silver-coated copper, gold-coated copper, and alloys thereof. In one embodiment of the invention, a conductive paste having silver nanoparticles may be used. Depending on the desired sintering (and, possibly, melting) temperature(s), the conductive paste composition used herein may further include additional elements. Such elements may include nano and microparticles of metal (including silver), microparticles of solder, and, in some situations, the addition of a conducting polymer and, even further, the addition of an organic material. Several examples of various compositions are provided below. An important aspect of this invention, is that the conductive paste, once positioned relative to the respective opening, will be capable of undergoing a sintering phase in which selected ones of the nanoparticles will sinter, thereby forming several contiguous circuit paths through the composition. In addition to sintering, the composition may also include elements (e.g., microparticles of solder or a metal) which will melt to thereby form still further contiguous paths for circuit flow. Importantly, if these added elements are used, the melting does not occur until at least sintering has begun and, possibly, after sintering has been achieved. The result of this of course is the formation of both circuit paths formed by sintering and melting, thereby assuring an excellently conducting thru-hole due to the presence of the conductive paste therein.

Suitable additional metal, including solder, are elements for use in the compositions taught herein may be referred to as low melting point (LMP) metallurgies, and are mixed with the primary metal (e.g., silver or a silver-copper mixture) nanoparticles. These include tin-lead, bismuth-tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. These secondary LMP metallurgies include melting points greater than that of the primary metal and therefore melt, once the primary metal has effectively sintered, or these LMP metallurgies may begin melting during the sintering, depending on how close to the melting point of same is relative to the corresponding melting point of the primary metal. A further understanding of this relationship is possible from the Examples provided below.

As understood, the function of the melted metallurgies (e.g., the solder particles) is to provide an enhanced electrical connection through the paste in the final substrate structure. Significantly, the primary nanoparticle metals as defined above will sinter and, if the additional LMP metallurgies are added, including possibly the additional conductive polymer (and, if desired, organic) these added LMP metallurgies will also melt during subsequent lamination procedures such as when the structure of FIG. 4 (or that of FIG. 5) is bonded to other dielectric and conductive layers, e.g., to form a larger, multilayered substrate such as a large PCB. The heat generated during such lamination is well known, and is necessary to adequately bond (laminate) the various layers together into such a thicker circuitized substrate. The elements of the paste composition will thus sinter and possibly melt form a series of interconnecting paths through the paste, thereby enhancing the connection formed. The dielectric layers of the structure are also not harmed because these layers have melting points greater than the sintering and melting temperatures and are able to withstand the lamination temperatures.

The above lamination, using conventional lamination equipment, may be accomplished at temperatures and pressures known in the art, and, as stated, serves to sinter (and melt, if appropriate) the paste compositions in the manner defined. The temperatures, times and pressures are different for alternative materials.

The five-substrate embodiment shown in FIG. 6 is representative only and not intended to limit the invention. It is within the scope of this invention to combine several additional substrates, including utilizing two or more interconnecting substrates as shown in FIG. 5 in combination with four or more substrates of the type represented by substrates 132, 133, and 134, to form other multilayered assemblies having many additional conductive layers and thus operational capabilities. These additional substrates may also be formed understandably, using the unique methodology taught herein. For example, substrate 132 may be formed by laminating two high temperature dielectric layers onto the interim conductive layer 138 (following clearance opening formation, if desired) and the thru-holes 144 then formed to the desired depths as shown. The outer circuit layers can be formed using conventional photolithographic processing known in the PCB art in which an outer copper layer is covered with a suitable photo-resist, the resist is developed to expose a pattern, and the structure is then etched to remove undesired (exposed) copper to produce the desired pattern. Such processing is known and further explanation is not considered necessary.

As explained above, the conductive paste may function as a conductive medium within a plated or non-plated opening with a designated dielectric layer (or layers). In addition, the paste may be used to simply couple electrical conductors on matching pairs of substrates. Such conductors may be formed using conventional photolithography processing, as mentioned, and serve as signal lines or pads for the layer-conductor "subcomposite." These subcomposites are aligned with the respective conductors on a corresponding facing (e.g., first) surface thereof also facing one another. Multilayer capable conductive paste of the type defined herein is positioned between the facing conductors (e.g., using a needle dispenser or printing operation) by preferably applying it to one subcomposite on the conductor(s) thereof.

The subcomposites are then laminated using conventional equipment and a circuitized substrate is formed, this substrate thus including, at a minimum, the two conductors (preferably two conductive planes each including a plurality of such conductors) electrically coupled using the conductive paste taught herein. This structure also includes, as a minimum, the two dielectric layers which support the conductive planes, respectively, albeit the two "blend" essentially into one from the heat and pressure of the lamination. Other conductive and dielectric layers may also be added to form a thicker, multilayered structure. The multilayer capable conductive paste described herein has the capability to enable the electrical and physical link up in one lamination process step of multilayer Z-interconnect structures potentially having differing CTEs and curing regimes.

Laminating multiple substrates concurrently or in a stepwise manner, such as multiple temperature/pressure set points, is possible using a multilayered paste, with substrates or paste having the following configurations, for example:

- At least three processing layers, such as PCBs or LCCs, and at least two processing layers for semiconductor devices.
- At least one LMP filler-based paste layer. The LMP-based paste may contain a fluxing agent for removal of oxidation and improved adhesion to exposed conductor surfaces.
- At least one nanoparticle-based paste.
- At least two different pastes with different metal content, for example: low-high loading paste—low loading paste, wherein high loading is silver/epoxy and wherein the silver content is approximately 90%, and low loading paste, also silver/epoxy, wherein the silver content is approximately 78%.

When using a multilayered paste, the following compositions of paste configurations are possible:

- Organic and metal particles,
- Organic and mixture of metal particles,
- Organic and LMP,
- Organic, metal, and LMP,
- Organic and carbon nanotubes,
- Organic and metal nanotubes, and
- Mixtures thereof.

The organic material can be polymer, monomer, oligomer, flux and combinations. Polymer can be selected from the group consisting of epoxy resin, high temperature diglycidyl ether, polyimide, cyanate ester (triazines), bismaleimide, bismaleimide and epoxy modified blend, benzoxazine, epoxy modified benzoxazine, halogen free benzoxazine, fluoropolymer, benzocyclobutene, perfluorobutane, polyphenylenesulfide, polyphenylene ether, polysulfone, polyetherimide, polyetherketone, polyphenylquinoxaline, polybenzoxazole, polyphenyl benzobisthiazole and combinations thereof. The polymer preferably contains epoxy with a glass transition temperature (Tg) of at least 30° C., whereas Ablebond epoxy has a Tg of approximately 90° C. Or the polymer contains silicones, such as GE brand adhesives. Or conducting polymers can be used.

When using a multilayered paste, the metallic component of the paste is selected from the group consisting of: copper, silver, gold, zinc, cadmium, palladium, iridium, ruthenium, osmium, rhodium, platinum, iron, cobalt, nickel, indium, tin, antimony, lead, bismuth and alloys thereof.

When using a multilayered paste, the solder component of the paste is selected from the group consisting of:

tin-lead, bismuth-tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof.

The average particle size of microparticle components used in a multilayered paste can range from approximately 1 micron to 50 microns. For nanoparticle components, average particle size ranges from approximately 5 nm to 100 nm and for submicron particles, average particle size should be above 100 nm but below 1 micron. Paste component can contain nano or micro or submicro particle or their mixtures.

Multilayered paste curing can be performed using conventional methods, such as thermal, temperature-pressure, and a UV/IR process.

Nanoparticle generally refers to the class of ultra fine metal particles with a physical structure or crystalline form that measures less than 100 nm in size. They can be 3D (block), 2D (plate), or 1D (tube or wire) structures. In general, nanoparticle-filled conductive adhesives are defined as adhesives containing at least some percentage of nanostructures (1D, 2D, and/or 3D) that enhance the overall electrical conductivity or sintering behavior of the adhesives. Conductivity is achieved through metal-metal bonding. Increasing the density of particles increases the probability of metal-metal contact. Each contact spot possesses a contact resistance. For microparticles, the density of particles is much less than for nanoparticles. In the case of a nano-micro mixture, the micro-scale particles can maintain a low contact resistance, whereas nanoscale particles can increase the number of particle contacts. Nano- and microparticle mixtures can be nanoparticle-microparticle, nanoplate (2D)-microparticle, nanotube (1D)-microparticle, or any combination thereof. A LMP filler melts and reduces inter-particle resistance. Hence, conductive adhesives can be categorized as nano, micro, nano-micro, or LMP based systems.

The above compositions and the examples below are examples only and are not intended to limit the scope of this invention. The following examples also represent various combinations of conductive paste compositions, in addition to the processes used to prepare such paste compositions, according to various aspects of the invention.

EXAMPLE 1

LMP filler-based paste was cured had uncured LMP filler-based paste applied prior to bonding. LMP filler-based paste is an example of transient liquid phase sintering (TLPS), which compositions employ a combination of a high melting point metal and a relatively low melting point alloy which undergo melting to form true metallurgical joints between the metal particles.

Sample preparation:
- One layer of LMP filler-based paste was deposited on silver surface and cured at 188° C./60 minutes in air;
- a second layer of uncured LMP filler-based paste was deposited on top of the cured paste;
- drilled pre-preg covering the unused space is placed on the silver surface; and
- assembly is laminated at around 200° C./120 minutes at 500 PSI.

Figure 7:
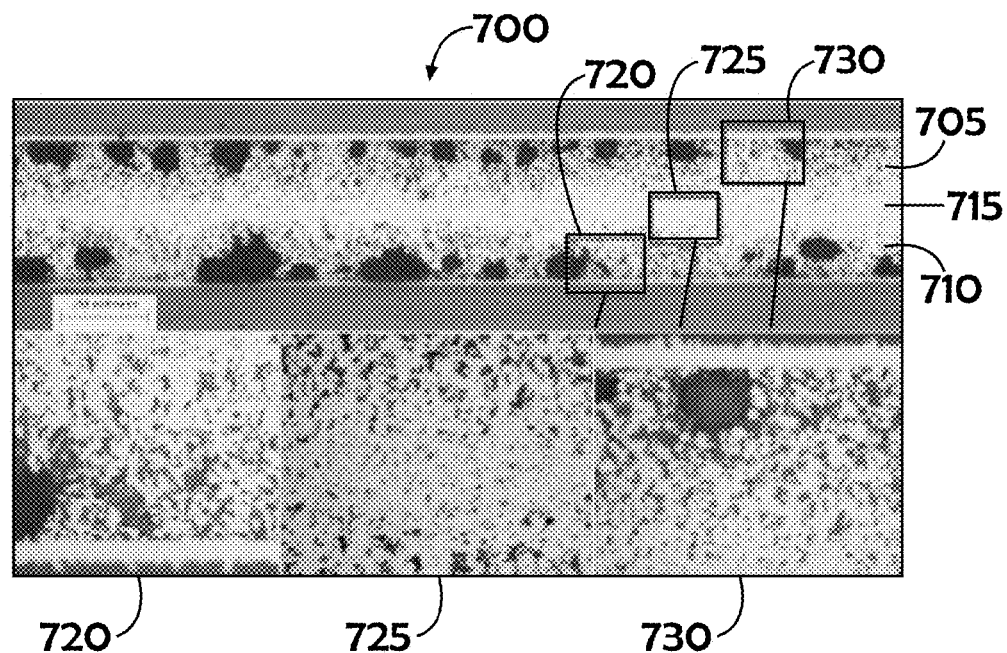
FIG. 7 is an optical micrograph that shows the interface between a multilayer conducting adhesive of uncured low melting point (LMP) filler-based paste applied to a cured LMP filler-based paste, and subsequently cured.

As is shown in FIG. 7, an optical micrograph of a sectioned view of example 1 shows that the uncured LMP filler-based paste 705 has wetted the cured LMP filler-based surface 710 and made uniform connections 715 during curing. The inset photos show increased magnification of the respective areas 720, 725, and 730.

Another embodiment that can be used in example 1 is silver, or other metal paste cured with a second layer of uncured LMP filler-based paste deposited on top of the cured metal paste.

EXAMPLE 2

Low metal loading silver paste was B-stage cured and had uncured high metal loading silver-paste applied prior to bonding, with the low metal loading paste having different epoxy and silver content from the high metal loading silver-paste.

Sample preparation:

A layer of low metal loading silver paste was deposited on a Cu surface and B-staged at 130° C./40 minutes;

a second layer of high metal loading silver paste was deposited on top of the B-staged low metal loading silver paste;

a drilled pre-preg covering the unused space was placed on the Cu surface; and the assembly was laminated at around 200° C./120 minutes at 500 PSI.

Figure 8:
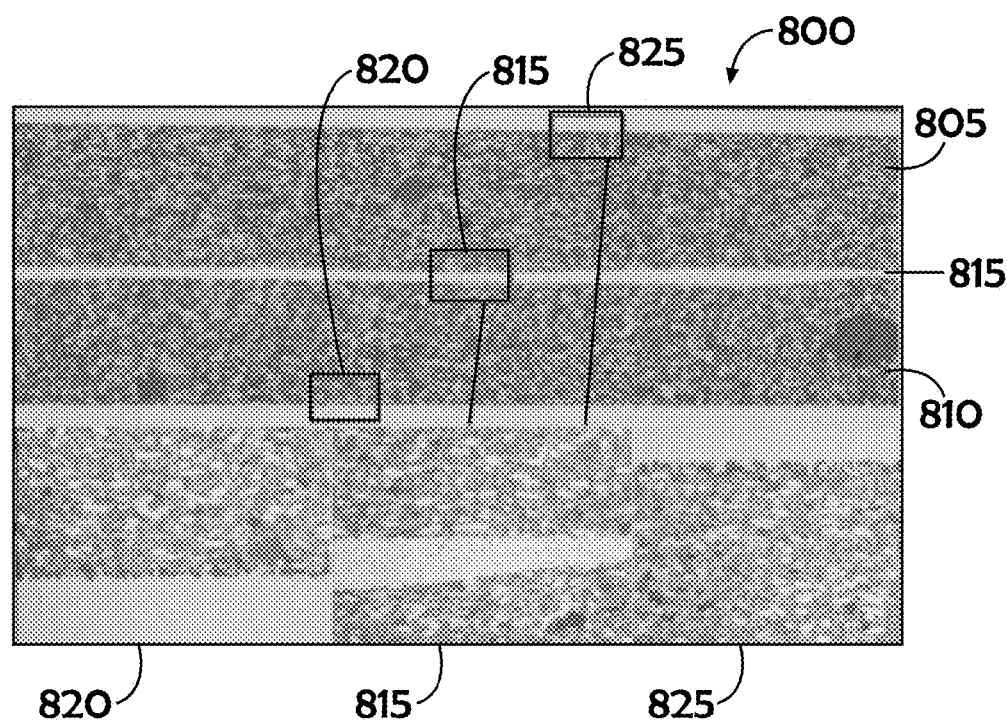
FIG. 8 is an optical micrograph of a metallic rich region between a multilayer conducting adhesive of low metal loading (78 wt % silver) and high metal loading (90 wt % silver) paste mixture after curing.

As is shown in FIG. 8, an optical micrograph of a sectioned view of example 2 discloses that a metallic rich region 815 is observed between the low metal loading silver 805 and high metal loading silver paste 810 applied prior to curing. The inset photos show increased magnification of the respective areas 820, 815, and 830.

Other embodiments that can be used in example 2 are high metal loading silver paste (B-staged) and uncured low metal loading silver paste, solder paste B-staged and uncured low loading or high loading, and LMP-based B-staged and uncured low loading or high loading silver paste.

EXAMPLE 3

Silver paste that was cured had uncured silver paste applied prior to bonding on gold surface.

Sample preparation:

One layer of Ag paste was deposited on Au surface and cured at 150° C./60 minutes;

a second layer of Ag-paste was deposited on top of the cured Ag paste;

a drilled pre-preg covering the unused space was placed on the Au surface; and the assembly was laminated at around 200° C./120 minutes at 500 PSI.

Figure 9A:
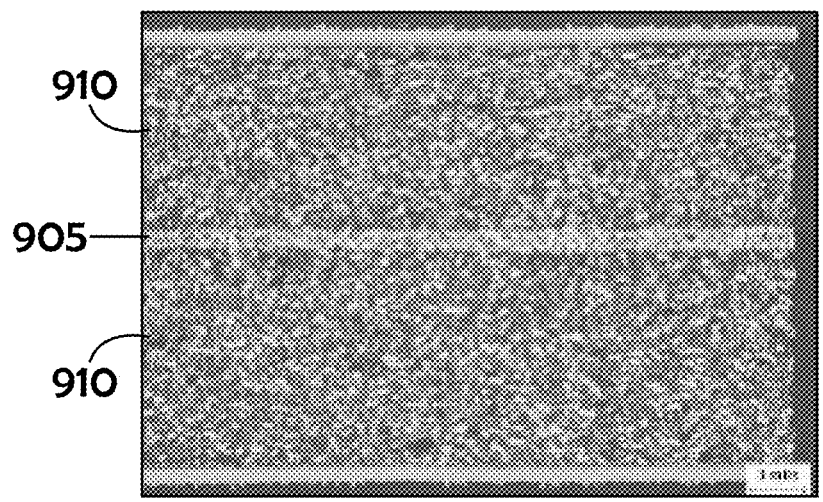
FIGS. 9a and 9b are an optical (FIG. 9a) and an SEM (FIG. 9b) micrograph that show that the metal concentration at the joining layer of multilayer conducting adhesive is higher than the bulk Ag paste section.
Figure 9B:
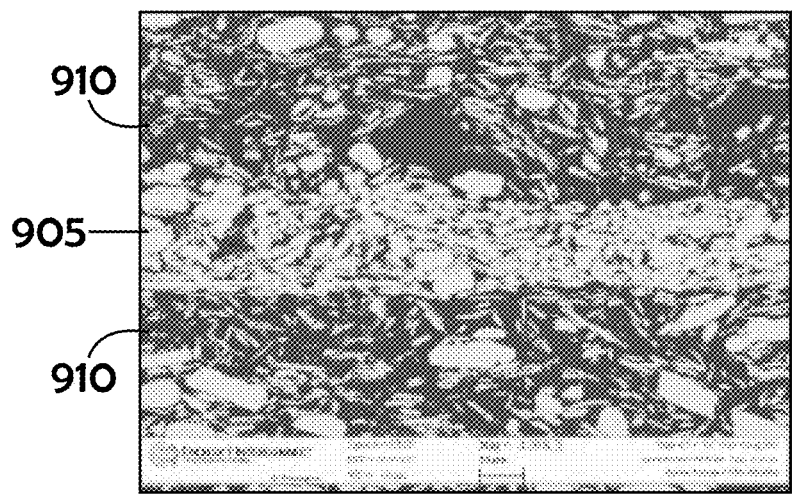

As shown in FIGS. 9a and 9b, an optical (FIG. 9a) and scanning electron microscope (FIG. 9b) micrograph of a sectioned view of example 3 depicts a metal concentration at the joining layer 905 higher than the bulk Ag paste 910 section.

Other embodiments that can be used in example 3 are a solder paste cured with an uncured low loading or high loading silver paste applied thereon, and an LMP-based paste cured with an uncured low loading or high loading silver paste applied thereon.

Figure 10:
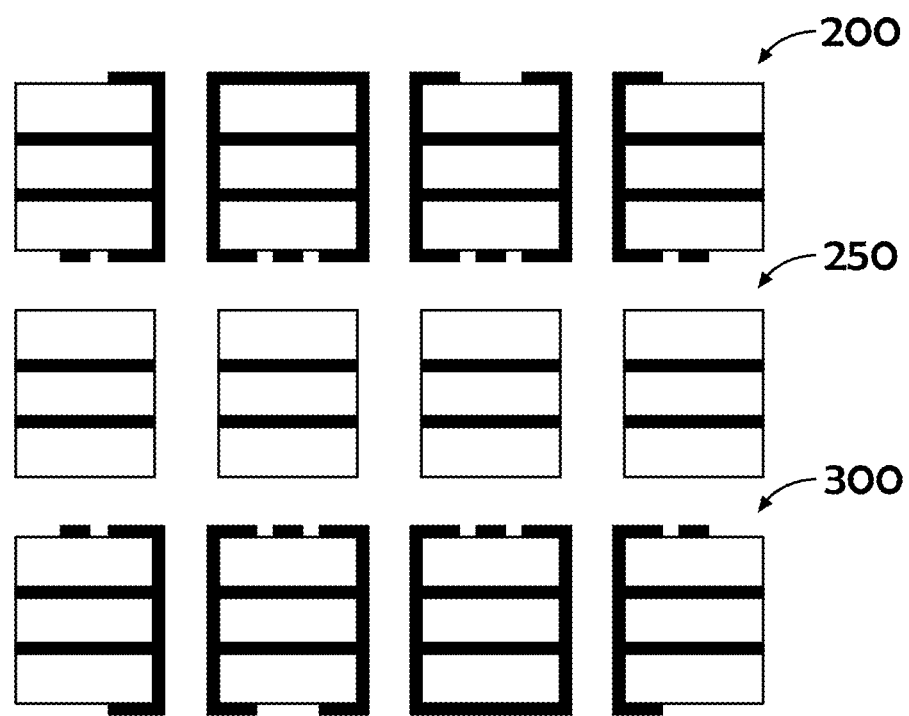
FIG. 10 is a side elevational view, in section, that shows three different subcomposite substrates having different thermal and mechanical properties prior to lamination using the inventive multilayer electrically conducting adhesive.

Example 4, also FIG. 10, shows 3 different subcomposite substrates prior to lamination, using the following progression to determine the paste for proper electrical and adhesive correlation:

1. all subcomposites 200, 250, and 300 require that a different layer be cured;
2. subcomposite 200 and 300 require cured or uncured or partially cured paste that survives circuitization and joining core subcomposite 250 requires a uncured or partially cured (B-staged) paste;
3. for a thermoplastic polymer-based conductive paste, all subcomposites including joining core subcomposites can use cured paste and lamination above or at the melting temperature of thermoplastic polymer can produce electrical connections;
4. subcomposite 200 and 300 require high electrical performance paste but joining core subcomposite 250 requires high electrical performance and high mechanical (adhesive) strength paste. In this case, subcomposite 200 and 300 can have very high metal loading, can be LMP based, and can be nano-LMP mixture whereas subcomposite 250 must have enough resin to bond to subcomposites 200 and 300, along with good electrical performance. A silver paste is preferable for subcomposite 250 due to high mechanical strength;
5. therefore, a multilayer conductive paste utilizing high electrical performance paste with a high metal loading being LMP based and/or nano-LMP for use with subcomposite 200 and 300, also having high mechanical (adhesive) strength and have enough resin to bond subcomposite 200 and 300 to subcomposite 250; and
6. For LMP based conductive paste, all subcomposites including joining core subcomposite can use cured paste and lamination above or at the melting temperature of LMP can produce electrical connections.

Subcomposite 200 and 300 can have a pad connect with PTH or micro-via and 250 can be a single drilled flowable dielectric. Bottom pad 200 and/or top pad 300 can have multilayer paste deposited. The bottom pad 200 and top pad 300 with multilayer paste are aligned with the opening 250 prior to lamination. Dielectric 250 flows during lamination and produces electrical connections between bottom pad 200 and top pad 300 using multilayer paste. A PTH of 200 and 300 can be filled and cured or partially cured with conducting or non-conducting paste. A filled PTH with cured paste of 200 and 300 can be cap plated further. Multilayer paste can be deposited on both (200 and 300) or at least one of the cap plated pad. It is also possible to deposit multilayer paste on top of a conductive paste-filled PTH of 200 and 300 subcomposites.

Figure 11:
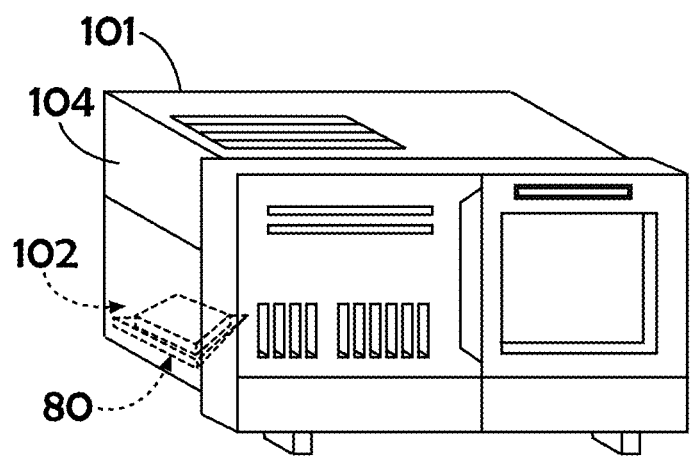
FIG. 11 is a view of an information handling system according to one embodiment of the invention.

As stated, each circuitized substrate formed in accordance with the teachings herein may be utilized within a larger substrate of known type such as a PCB, chip carrier or the like. FIG. 6 illustrates one of these larger components, multilayered circuitized substrate assembly 130, which may be positioned within and electrically coupled to an information handling system (IHS) 101 as shown in FIG. 11, which may be in the form of a personal computer, mainframe, computer server, etc. Multilayered circuitized substrate assembly 130, is typically electrically coupled to other substrates 132, 134, and 136 to form a processing assemblage within IHS 101. For example, one or more circuitized substrates 132, each forming a particular circuitized "core" (e.g., a "power core") within multilayered circuitized substrate assembly 130, may be utilized to afford the PCB the highly advantageous teachings of the invention. Or, as stated, the entire PCB may comprise circuitized substrates as taught here. Many different combinations of circuitized substrate 130 are thus possible.

In FIG. 11, there is shown an IHS 101 in accordance with one embodiment of the invention. IHS 101 may comprise a personal computer, mainframe computer, computer server, or the like, several types of which are well known in the art. IHS 101, as taught herein, may include one or more of the electrical assemblies shown in FIG. 6, including multilayered circuitized substrate assembly 130, these being represented by reference numeral 102 in FIG. 11. This completed assembly, not shown, may be mounted on a still larger PCB or other substrate 80, one example being a "motherboard" of much larger size, should such a board be required. These components are shown hidden because they are enclosed within and thus behind a suitable housing 105 designed to accommodate the various electrical and other components which form part of IHS 101.

Multilayered circuitized substrate assembly 130 may instead comprise such a motherboard in IHS 101 and thus include additional electrical assemblies, including additional printed circuit cards mounted thereon, such additional cards in turn also possibly including additional electronic components as part thereof. The electrical assemblies made in accordance with the unique teachings herein may be utilized in various structures as part of a much larger system, such as the IHS 101. Further description is not believed necessary.

Thus it is possible to make a multi-layer paste-based Z-interconnect substrate with a different layer to layer composition, and/or with a different conducting zone, and/or with different micro structures (sintering, melting, particle connection). In multilayer paste-based Z-interconnect structures, the composition at the paste-paste interface varies from the individual paste layer. For LMP-based paste, even single layer paste produces a different composition, especially the composition at the joining (Cu pad to paste) area. This composition is different from a bulk paste composition.

Since other combinations, modifications and changes varied to fit particular operating requirements and environments will be apparent to those skilled in the art, the invention is not considered limited to the chosen preferred embodiments for purposes of this disclosure, but covers all changes and modifications which do not constitute departures from the true spirit and scope of this invention.

Having thus described the invention, what is desired to be protected by Letters Patent is presented in the subsequently appended claims.

What is claimed is:

1. A multilayer capable electrically conductive adhesive (ECA) mixture for connecting multilevel Z-axis interconnects, comprising:
    a first bondable conducting paste formulation having a first melting point and containing a first particle rich region; and
    a second bondable conducting paste formulation having a second melting point different from said first melting point and containing a second particle rich region, said first and second bondable conducting paste formulations, upon lamination, forming a composition at a paste-paste interface and a single electrically conducting Z-interconnect joint.

2. The multilayer capable ECA of claim 1, wherein said first and said second conducting paste formulations contain at least one low melting point alloy.

3. The multilayer capable ECA of claim 2, wherein said first and said second conducting paste formulations contain at least one metal filler.

4. The multilayer capable ECA of claim 3, wherein said metal filler is chosen from the group: copper, silver, gold, zinc, cadmium, palladium, iridium, ruthenium, osmium, rhodium, platinum, iron, cobalt, nickel, indium, tin, antimony, lead, bismuth, and alloys thereof.

5. The multilayer capable ECA of claim 3, wherein said first conducting paste formulation and said second conducting paste formulation maintain their respective particle rich regions during subsequent processes.

6. The multilayer capable ECA of claim 1, wherein said particle rich regions can contain a mixture of micro and nanoparticles, an average particle size being approximately 1 micron to 20 microns for microparticles and approximately 20 nm to 300 nm for nanoparticles.

7. The multilayer capable ECA of claim 1, wherein said first conducting paste formulation and said second conducting paste formulation comprise at least one solder chosen from the group: tin-lead, bismuth-tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof.

8. The multilayer capable ECA of claim 1, wherein said first conducting paste formulation and said second conducting paste formulation comprise at least two components chosen from the group: polymer, metal particles, LMP alloy, carbon nanotubes, metal nanotubes, and mixtures thereof.

9. The method of claim 1, wherein said temperature at said flowing of said first conducting paste of said multilayer capable ECA is within the range of from approximately 90° Centigrade to approximately 400° Centigrade and said flowing of said second conducting paste of said multilayer capable ECA is within the range of from approximately 90° Centigrade to approximately 400° Centigrade.

10. A method of making a circuitized substrate assembly, comprising:
    providing a plurality of circuitized substrate subassemblies including a plurality of metallic conductor pads as part thereof, wherein each of said circuitized substrate subassemblies includes a disparate coefficient of thermal expansion (CTE) compared to said circuitized substrate subassembly proximal neighbor;
    aligning said plurality of circuitized substrate subassemblies relative to one another such that each of said plurality of metallic conductor pads of said plurality of circuitized substrate subassemblies is aligned with an adjacent one of said plurality of metallic conductor pads of said plurality of circuitized substrate subassemblies in a facing pair wise manner;
    positioning a flowable dielectric layer between said plurality of circuitized substrate subassemblies;
    depositing a quantity of multilayer capable electrically conductive adhesive (ECA) mixture on both of said metallic conductor pads of each of said facing pair wise of said aligned and facing metallic conductor pads of said plurality of circuitized substrate subassemblies; and
    bonding said plurality of circuitized substrate subassemblies together using heat and pressure, resulting is a composition at a paste-paste interface, so that the metallurgies of said multilayer capable ECA and said composition at said paste-paste interface and said metallic conductor pads are combined to form an electrical connection therebetween.

11. The method of claim 10, further including flowing said quantities of multilayer capable ECA after said depositing of said quantities thereof on said at least one of said metallic conductor pads.

12. The method of claim 11, wherein said flowing of said quantities of multilayer capable ECA occurs during said bonding of said plurality of circuitized substrate subassemblies together.

13. The method of claim 10, wherein said metallic conductor pads of each of said aligned and facing metallic conductor pads include a multilayer capable ECA layer thereon, a first portion of said multilayer capable ECA flowing at a first temperature, a second portion of said multilayer capable ECA layer flowing at a second temperature greater than said first temperature.

14. The method of claim 10, wherein multilayer capable ECA comprises at least one metal chosen from the group: copper, silver, gold, zinc, cadmium, palladium, iridium, ruthenium, osmium, rhodium, platinum, iron, cobalt, nickel, indium, tin, antimony, lead, bismuth and alloys thereof.

15. The method of claim 10, wherein multilayer capable ECA comprises at least one solder chosen from the group: tin-lead, bismuth-tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof.

16. The method of claim 10, wherein multilayer capable ECA comprises at least two components chosen from the group: polymer, metal particles, LMP alloy, carbon nanotubes, metal nanotubes, and mixtures thereof.

17. The method of claim 10, wherein multilayer capable ECA comprises at least one polymer chosen from the group: epoxy, silicones, and conducting polymers.

18. The method of claim 17, wherein said epoxies have a glass transition temperature (Tg) of approximately 80° Centigrade to approximately 90° Centigrade.

19. The method of claim 10, wherein said bonding process comprises at least one type chosen from the group: thermal, temperature-pressure, and UV/IR.

20. The method of claim 10, wherein said bonding of said plurality of circuitized substrate subassemblies together occurs for approximately 30 minutes to approximately 500 minutes.

21. The method of claim 20, wherein said heat during said bonding is at a temperature within the range of from approximately 100° Centigrade to approximately 400° Centigrade and said pressure is within the range of from approximately 100 PSI to approximately 3000 PSI.

22. The method of claim 10, wherein the magnitude of each of said circuitized substrate subassembly disparate CTEs is counterbalanced by said multilayer capable ECA.

23. The method of claim 10, wherein said flowable dielectric layer comprises a B-staged pre-preg material.

24. A circuitized substrate, comprising:
a plurality of spaced-apart electrically conductive layers;
a plurality of organic dielectric layers including first and second opposing surfaces, said plurality of organic dielectric layers being positioned between pairs of said spaced-apart electrically conductive layers, wherein at least one of said plurality of organic dielectric layers comprises a single-drilled flowable dielectric material, and further comprising a pad comprising a multilayer paste disposed on said at least one of said plurality of organic dielectric layers, said pad comprising at least one of the features: a PTH and a micro-via;
at least one opening within said plurality of organic dielectric layers and extending through said plurality of spaced-apart electrically conductive layers; and
a quantity of multilayer capable electrically conductive adhesive (ECA) mixture positioned within said at least one opening, said quantity of multilayer capable ECA including at least one metallic component including a plurality of particles and said quantity of multilayer capable ECA electrically coupling said respective plurality of spaced-apart electrically conductive layers, wherein said multilayer capable ECA forms a layer-to-layer composition having a conducting zone.

25. The circuitized substrate of claim 24, wherein said plurality of organic dielectric layers comprise a material selected from the following group: fiberglass-reinforced epoxy resin, polytetrafluoroethylene, polyimide, polyamide, cyanate resin, photo-imageable material, and combinations thereof.

26. The circuitized substrate of claim 24, wherein said at least one opening is a thru-hole.

27. The circuitized substrate of claim 24, wherein said metallic component is chosen from the following group: copper, silver, gold, zinc, cadmium, palladium, iridium, ruthenium, osmium, rhodium, platinum, iron, cobalt, nickel, indium, tin, antimony, lead, bismuth, and alloys thereof.

28. The circuitized substrate of claim 24, wherein said quantity of multilayer capable ECA further includes solder particles as part thereof.

29. The circuitized substrate of claim 28, wherein said solder is chosen from the following group: tin-lead, bismuth- tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof.

30. The circuitized substrate of claim 28, wherein said solder particle sizes are chosen from the group: microparticle and nanoparticle.

31. The circuitized substrate of claim 30, wherein said quantity of multilayer capable ECA further includes a conducting polymer.

32. The circuitized substrate of claim 31, wherein said quantity of multilayer capable ECA further includes an organic material.

33. The circuitized substrate of claim 32, wherein said organic material comprises an epoxy resin.

34. The circuitized substrate of claim 24, wherein said quantity of multilayer capable ECA further includes a second metallic component having particles with sizes chosen from the group: microparticle and nanoparticle.

35. The circuitized substrate of claim 34, wherein said quantity of multilayer capable ECA further includes at least one object selected from the group comprising: conducting polymer, organic material, and epoxy resin.

36. The circuitized substrate of claim 35, wherein said quantity of multilayer capable ECA has a sintering phase in which selected ones of the nanoparticles will sinter forming contiguous circuit paths between said plurality of organic dielectric layers and extending therethrough said plurality of spaced-apart electrically conductive layers.

37. The circuitized substrate of claim 36, wherein said quantity of multilayer capable ECA microparticles of said solder and said metal form contiguous paths for circuit flow between said plurality of organic dielectric layers and extending therethrough said plurality of spaced-apart electrically conductive layers.

38. The circuitized substrate of claim 24, wherein said pad is aligned with at least one of said PTH and micro-via prior to lamination thereof.

39. The circuitized substrate of claim 38, wherein said flowable dielectric material flows during said lamination and produces an electrical connection with said pad.

40. The circuitized substrate of claim 39, wherein said at least one of said PTH and micro-via can be filled with at least one of: cured and partially cured with at least one of conducting and non conducting paste.

41. The circuitized substrate of claim 24, further including at least one electrical component electrically coupled to said multilayer capable ECA, said circuitized substrate and said at least one electrical component forming an electrical assembly.

42. An information handling system (IHS) comprising:
a housing; and
a circuitized substrate positioned substantially within said housing and including a plurality of circuitized substrate subassemblies including a plurality of metallic conductor pads as part thereof, said plurality of metallic conductor pads aligning in a facing pair wise manner with said plurality of metallic conductor pads aligned of an adjacent said plurality of metallic conductor pads, positioning a flowable dielectric layer between said plurality of circuitized substrate subassemblies, said pads comprising a multilayer paste and comprising at least one of the features: a PTH and a micro-via; having a quantity of multilayer capable electrically conductive adhesive (ECA) on one of said metallic conductor pads of each of said facing pair wise of said aligned and facing metallic conductor pads of said plurality of circuitized substrate subassemblies, said plurality of circuitized substrate subassemblies bonded together in such a manner that the metallurgies of said multilayer capable ECA and said metallic conductor pads in said aligned and facing metallic conductor pads are combined to form an electrical connection therebetween and at least one electrical component positioned on and electrically coupled to said circuitized substrate.

43. The IHS of claim 42, comprising an object selected from at least one of the group comprising: personal computer, mainframe computer, and computer server.

\* \* \* \* \*